United States Patent [19]

Williams

[11] Patent Number: 5,640,523

[45] Date of Patent: Jun. 17, 1997

[54] METHOD AND APPARATUS FOR A PULSED TRI-STATE PHASE DETECTOR FOR REDUCED JITTER CLOCK RECOVERY

[75] Inventor: Bertrand J. Williams, Campbell, Calif.

[73] Assignee: Cypress Semiconductor Corporation, San Jose, Calif.

[21] Appl. No.: 598,157

[22] Filed: Feb. 7, 1996

Related U.S. Application Data

[63] Continuation of Ser. No. 300,644, Sep. 2, 1994, abandoned.

[51] Int. Cl.$^6$ ............................. H03K 7/08; H03D 1/00; H04L 7/02; H04L 7/00

[52] U.S. Cl. .................... 375/360; 375/238; 375/340; 375/348; 375/371

[58] Field of Search .................................. 375/238, 340, 375/359, 360, 348, 371, 374, 375, 376; 327/7, 8, 10, 12, 144, 147, 148, 149, 153, 161, 236

[56] References Cited

U.S. PATENT DOCUMENTS

| | | |
|---|---|---|
| 3,610,954 | 10/1971 | Treadway . |
| 3,925,614 | 12/1975 | Bousmar . |
| 3,986,125 | 10/1976 | Eibner ........................................ 327/10 |
| 4,218,771 | 8/1980 | Hogge, Jr. . |
| 4,280,099 | 7/1981 | Rattlingourd ........................ 375/374 |
| 4,330,863 | 5/1982 | Wright . |
| 4,339,731 | 7/1982 | Adams . |
| 4,422,176 | 12/1983 | Summers ............................... 375/376 |
| 4,464,771 | 8/1984 | Sorensen ............................... 375/374 |
| 4,490,688 | 12/1984 | Borras ..................................... 331/4 |

(List continued on next page.)

FOREIGN PATENT DOCUMENTS

| | | |
|---|---|---|
| 2573592 | 5/1986 | France . |
| 2588433 | 4/1987 | France . |

OTHER PUBLICATIONS

Hogge, C.R., Jr., "A Self Correcting Clock Recovery Circuit," *Journal of Lightwave Technology*, vol. LT-3, No. 6, pp. 1312–1314 (Dec. 1985).

Lee, T.H., et al., "A 155–MHz Clock Recovery Delay–and Phase–Locked Loop," *IEEE Journal of Solid–State Circuits*, vol. 27, No. 12, pp. 1736–1746 (Dec. 1992).

Messerschmitt, D.G., "Frequency Detectors for PLL Acquisition in Timing and Carrier Recovery," *IEEE Transactions on Communications*, vol. COM–27, No. 9, pp. 1288–1295 (Sep. 1979).

Llewellyn, W. D., "Session I: High–Speed Data Recovery WAM 1.1: A 33Mb/s Data Synchronizing Phase–Locked–Loop Circuit," *Digest of Technical Papers*, IEEE International Solid–State Circuits Conference, Feb. 17, 1988, pp. 12–13, 276–277 (1988).

Lai, B., et al., "A Monolithic 622Mb/s Clock Extraction Data Retiming Circuit," ISSCC, pp. 144–145 (1991).

Walker, R.C., et al., "A 1.5 Gb/s Link Interface Chipset for Computer Data Transmission," *IEEE Journal on Selected Areas in Communications*, vol. 9, No. 5, pp. 698–703 (Jun. 1991).

Walker, R.C., et al., "A Two–Chip 1.5 GBd Serial Link Interface," *IEEE Journal of Solid–State Circuits*, vol. 27, No. 12, pp. 1805–1810 (Dec. 1992).

*Primary Examiner*—Wellington Chin
*Assistant Examiner*—Vijay Shankar
*Attorney, Agent, or Firm*—Blakely Sokoloff Taylor & Zafman

[57] ABSTRACT

A phase detector detects a transition edge on a received data signal and generates a pump-down reference pulse and a pump-up, variable width pulse indicative of phase to synchronize a local clock with the received data signal. The variable width pulse overlaps in time with the reference pulse. The reference pulse is subtracted from the variable width pulse, and the resulting difference signal is supplied in an integrated format to a voltage controlled oscillator (VCO) that controls the frequency of the local clock. When the phase detector is balanced, the variable width pulse and the reference pulse substantially cancel out one another, providing for relatively reduced jitter for the local clock.

14 Claims, 8 Drawing Sheets

U.S. PATENT DOCUMENTS

| | | |
|---|---|---|
| 4,520,489 | 5/1985 | Hogge, Jr. . |
| 4,535,459 | 8/1985 | Hogge, Jr. ................................ 375/376 |
| 4,538,283 | 8/1985 | Hogge, Jr. . |
| 4,546,486 | 10/1985 | Evans ..................................... 375/374 |
| 4,555,789 | 11/1985 | Hogge, Jr. . |
| 4,561,098 | 12/1985 | van Tol . |
| 4,565,976 | 1/1986 | Campbell . |
| 4,584,695 | 4/1986 | Wong et al. . |
| 4,587,653 | 5/1986 | Hogge, Jr. . |
| 4,686,481 | 8/1987 | Adams . |
| 4,724,401 | 2/1988 | Hogge, Jr. et al. . |
| 4,775,890 | 10/1988 | Balaban .................................. 375/371 |
| 4,782,499 | 11/1988 | Clendening ............................. 375/371 |
| 4,788,512 | 11/1988 | Hogge, Jr. et al. . |
| 4,811,361 | 3/1989 | Bacou et al. . |
| 4,821,293 | 4/1989 | Shimizume et al. . |
| 4,884,041 | 11/1989 | Walker ...................................... 331/57 |
| 4,926,447 | 5/1990 | Corsetto et al. ......................... 375/120 |
| 5,015,970 | 5/1991 | Williams et al. . |
| 5,036,298 | 7/1991 | Bulzachelli . |
| 5,036,529 | 7/1991 | Shin ........................................ 375/374 |
| 5,077,529 | 12/1991 | Ghoshal ................................. 375/371 |
| 5,077,761 | 12/1991 | Tokunaga ............................... 375/371 |
| 5,260,608 | 11/1993 | Marbot . |
| 5,268,937 | 12/1993 | Marbot . |
| 5,305,453 | 4/1994 | Boudry et al. . |

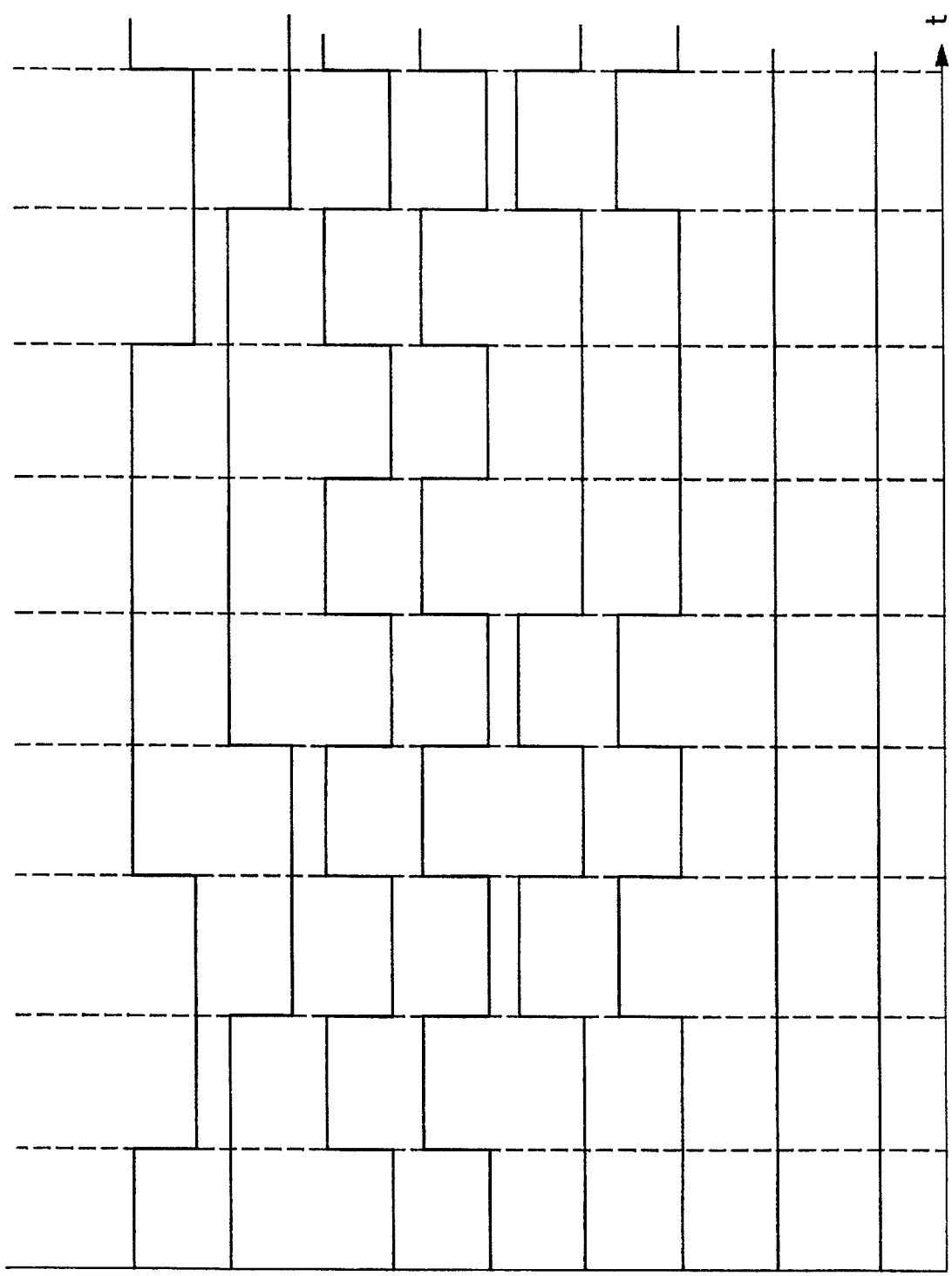

METHOD AND APPARATUS FOR A PULSED TRI-STATE PHASE DETECTOR FOR REDUCED JITTER CLOCK RECOVERY

This is a continuation of application Ser. No. 08/300,644 filed Sep. 2, 1994, now abandoned.

BACKGROUND OF THE INVENTION

1. Field of the Invention

The present invention relates generally to the field of electrical devices. More particularly, the present invention relates to the field of phase-locked loops.

2. Description of the Related Art:

For the synchronous transmission of digital data for typical systems, a transmitting unit transmits a data signal at a constant rate as determined by a clock local to the transmitting unit, and a receiving unit attempts to receive the data signal at the same constant rate. The transmitting unit may transmit the data signal without a clock signal as the system then requires only approximately one-half of the bandwidth necessary for the transmission of a data signal with a clock signal. To receive transmitted data signals with minimized errors, then, the receiving unit attempts to recover the clock signal associated with the data signal.

To recover the clock signal, the receiving unit may use a phase-locked loop (PLL) clock recovery system that includes a phase detector and a voltage controlled oscillator (VCO) that controls the frequency of the clock local to the receiving unit. The phase detector detects the phase difference between the received data signal and the clock local to the receiving unit (i.e., phase error), and then modulates the frequency of this local clock to bring the local clock into approximately the same phase and frequency as the received data signal.

To modulate the frequency of the local clock, a typical phase detector generates and outputs a pump-up pulse on a pump-up node and a pump-down pulse on a pump-down node. The frequency of the local clock is increased by a pump-up pulse and is decreased by a pump-down pulse. The signal on the pump-down node is subtracted from the signal on the pump-up node to produce a difference signal. This difference signal is integrated by an integrator, and the resulting integrated signal may be used as a control signal for the voltage controlled oscillator (VCO) to control the frequency of the local clock. In this manner, the receiving unit synchronizes its local clock to minimize errors in receiving transmitted data.

BRIEF SUMMARY AND OBJECTS OF THE INVENTION

One object of the present invention is to provide for a phase detector for relatively reduced jitter clock recovery.

Another object of the present invention is to provide for a phase detector that minimizes errors in receiving data signals.

A method for outputting a variable width pulse indicative of phase and a reference pulse as phase detector outputs is described. A first data signal having a first transition edge is received, and the first transition edge of the first data signal is detected. A reference pulse is output in response to the detection of the first transition edge of the first data signal. A variable width pulse indicative of phase is output in response to the detection of the first transition edge of the first data signal. The variable width pulse overlaps in time with the reference pulse.

A phase detector for outputting a variable width pulse indicative of phase and a reference pulse is also described. The phase detector includes first circuitry for receiving a first data signal having a first transition edge and for detecting the first transition edge of the first data signal. The phase detector also includes second circuitry, coupled to the first circuitry, for outputting a reference pulse in response to the detection of the first transition edge of the first data signal. The phase detector further includes third circuitry, coupled to the first circuitry, for outputting a variable width pulse indicative of phase in response to the detection of the first transition edge of the first data signal. The third circuitry outputs the variable width pulse such that the variable width pulse overlaps in time with the reference pulse.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 8 illustrates a waveform diagram for the phase detector of FIG. 7.

DETAILED DESCRIPTION

Figure 1:
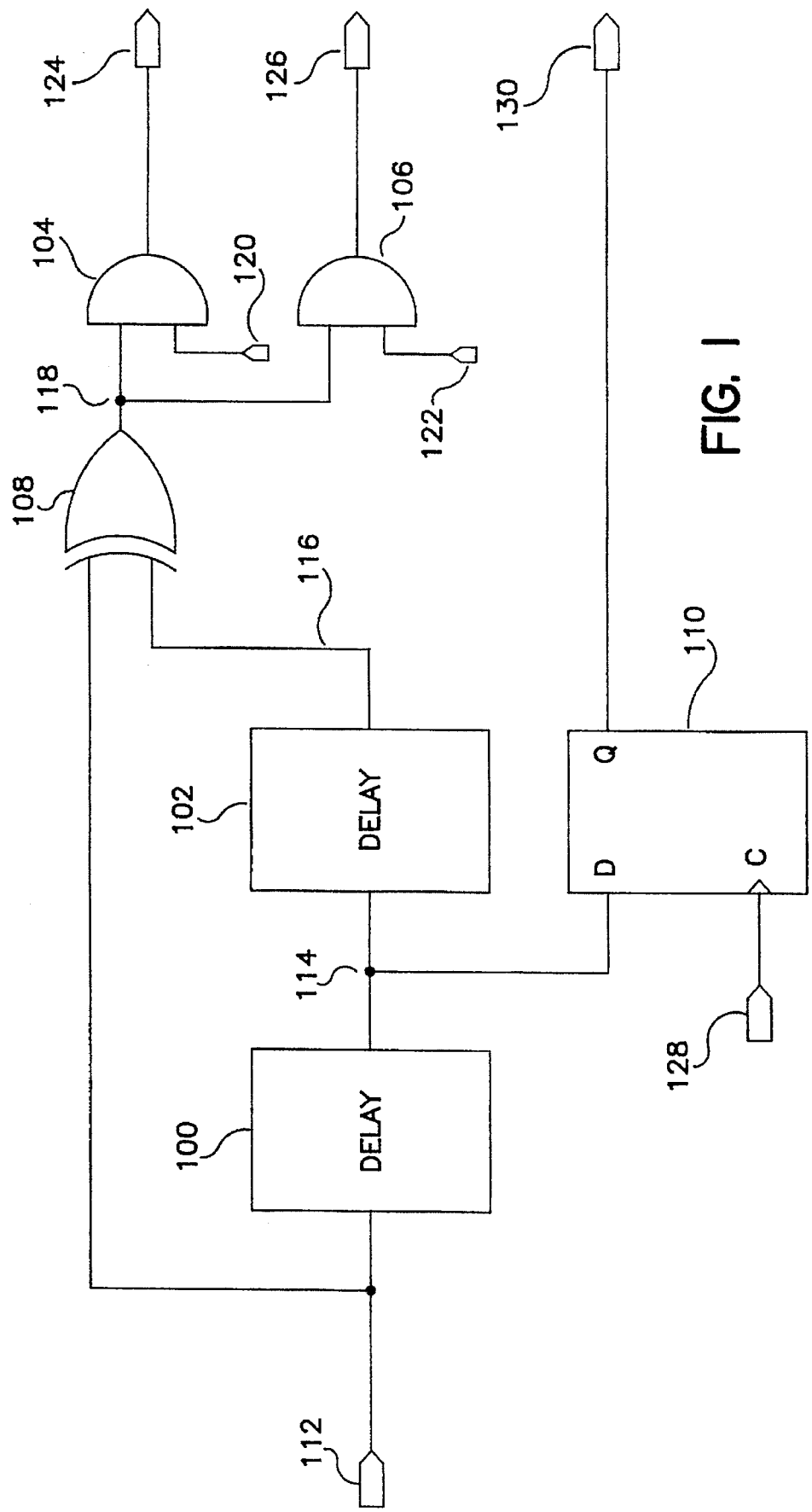
FIG. 1 illustrates circuitry for one phase detector.

The following detailed description sets forth a specific embodiment or embodiments in accordance with the present invention for a method and apparatus for a pulsed tri-state phase detector for reduced jitter clock recovery. In the following description, specific details are set forth such as specific circuitry configurations, timing, etc., in order to provide a thorough understanding of the present invention. It will be evident, however, that the present invention may be practiced without these specific details. In other instances, well-known circuit elements, gates, etc., have not been described in particular detail so that the present invention is not unnecessarily obscured.

For the synchronous transmission of digital data for a system, a transmitting unit transmits a data signal at a constant rate as determined by a clock local to the transmitting unit, and a receiving unit attempts to receive the data signal at the same constant rate. The transmitting unit transmits the data signal without a clock signal. To receive transmitted data signals with minimized errors, the receiving unit attempts to recover the clock signal associated with the data signal.

To recover the clock signal, the receiving unit may use a phase-locked loop (PLL) clock recovery system that includes a phase detector and a voltage controlled oscillator (VCO) that controls the frequency of the clock local to the receiving unit, or local clock. Unless otherwise specified, the term local clock includes the clock local to the receiving unit. The phase detector detects the phase difference between the received data signal and the local clock (i.e., phase error), and then modulates the frequency of the local clock to bring the local clock into approximately the same phase and frequency as the received data signal.

To modulate the frequency of the local clock, the phase detector generates and outputs a pump-up pulse on a pump-up node and a pump-down pulse on a pump-down node. The frequency of the local clock is increased by a pump-up pulse and is decreased by a pump-down pulse. The signal on the pump-down node is subtracted from the signal on the pump-up node to produce a difference signal. This difference signal is integrated by an integrator, and the resulting integrated signal may be used as a control signal for the voltage controlled oscillator (VCO) to control the frequency of the local clock.

The phase detector may modulate the frequency of the local clock for each transition edge in the data signal. The transition edge in the data signal includes an edge formed by a transition between a high or logical-one data signal and a low or logical-zero data signal, or vice versa. If the frequency of the local clock needs to be increased, the phase detector generates a pump-up pulse having a relatively longer duration than the pump-down pulse to increase the clock frequency. If the frequency of the local clock needs to be decreased, the phase detector generates a pump-down pulse having a relatively longer duration than the pump-up pulse to decrease the clock frequency. In this manner, the receiving unit synchronizes its local clock to minimize errors in receiving transmitted data.

When the local clock is synchronized with the transmitted data signals, the phase detector is balanced. The phase detector may be balanced when the phase error between the local clock and a received data signal is approximately zero. That is, a transition edge of the data signal is aligned with a transition edge of the local clock. Other phase detectors may be balanced when the phase error between the local clock and a delayed version of the received data signal, for example, is approximately zero. When a transition edge is detected in a data signal, a balanced phase detector may nevertheless generate a pump-up pulse followed by a pump-down pulse of approximately equal amplitude and duration as the pump-up pulse, or vice versa, even though the local clock is synchronized with the data signal. This may result in Type I and Type II clock feedthrough.

Type I clock feedthrough occurs when the phase detector outputs a pump-up pulse followed by a pump-down pulse even though the local clock is synchronized with a received data signal. The frequency of the local clock is increased during the pump-up pulse and then decreased during the pump-down pulse, creating jitter for the local clock.

Type II clock feedthrough occurs when the signal on the pump-down node is subtracted from the signal on the pump-up node and the integral of the resulting difference signal over time is not equal to approximately zero. This causes a net DC imbalance in the control signal that changes the frequency of the local clock. The net DC imbalance in the control signal causes dynamic phase offsets in the local clock as a function of transition edge density in received data signals, creating jitter for the local clock.

Jitter includes abrupt, spurious variations in the phase of successive local clock pulses, as compared to the phase of a continuous oscillator. As Type I and Type II clock feedthrough result in relatively increased jitter for the local clock, the ability of the receiving unit to receive data signals with minimized errors becomes limited.

FIG. 1 illustrates one phase detector. The phase detector of FIG. 1 includes delay circuitry 100 and 102, AND gates 104 and 106, exclusive-OR (XOR) gate 108, and D-type flip-flop 110. The propagation delay of delay circuitry 100 may be equal to approximately one-quarter of the period of the clock local to the transmitting unit, for example. The propagation delay of delay circuitry 102 may also be equal to approximately one-quarter of the period of the clock local to the transmitting unit, for example.

For the phase detector of FIG. 1, a data signal is received on node 112 from a transmitting unit. Node 112 is coupled to the input terminal of delay circuitry 100 and the first input terminal of XOR gate 108. The output terminal of delay circuitry 100, node 114, is coupled to the input terminal of delay circuitry 102. The output terminal of delay circuitry 102, node 116, is coupled to the second input terminal of XOR gate 108. The output terminal of XOR gate 108, node 118, is coupled to the first input terminal of AND gate 104 and to the first input terminal of AND gate 106. The second input terminal of AND gates 104 and 106 are respectively coupled to nodes 120 and 122. Node 120 is coupled to the local clock, and node 122 is coupled to the logical inversion of the local clock. The output terminals of AND gates 104 and 106 are nodes 124 and 126, respectively. Node 114 is additionally coupled to the D terminal of D-type flip-flop 110. The C or clock terminal and the Q terminal of D-type flip-flop 110 are respectively coupled to node 128 and node 130. Node 128 is coupled to the local clock.

Delay circuitry 100 delays the propagation of the data signal on node 112 and outputs the delayed data signal on node 114. Delay circuitry 102 delays the propagation of the data signal on node 114 and outputs the delayed data signal on node 116. XOR gate 108 exclusive-ORs the data signal on node 112 with the delayed data signal on node 116. XOR gate 108 as a result outputs a pulse of known polarity after every transition edge on node 112 that is independent of the transition edge polarity. The output of XOR gate 108 is ANDed with the local clock by AND gate 104, producing a pump-up signal on node 124. The output of XOR gate 108 is also ANDed with the logical inversion of the local clock by AND gate 106, producing a pump-down signal on node 126.

The data signal received on node 112 is recovered on node 130 for the phase detector of FIG. 1. D-type flip-flop 110 is clocked off the appropriate edge, for example the rising edge, of the local clock and samples the delayed data signal on node 114 to generate the data signal on node 130.

The pump-down signal on node 126 may be subtracted from the pump-up signal on node 124 to produce a difference signal, and this difference signal may be integrated by an integrator. The resulting integrated signal may be used as a control signal for a voltage controlled oscillator (VCO) that controls the frequency of the local clock and of the logical inversion of the local clock. The frequency of the VCO changes as a function of the integrated value of the control signal.

Figure 2:
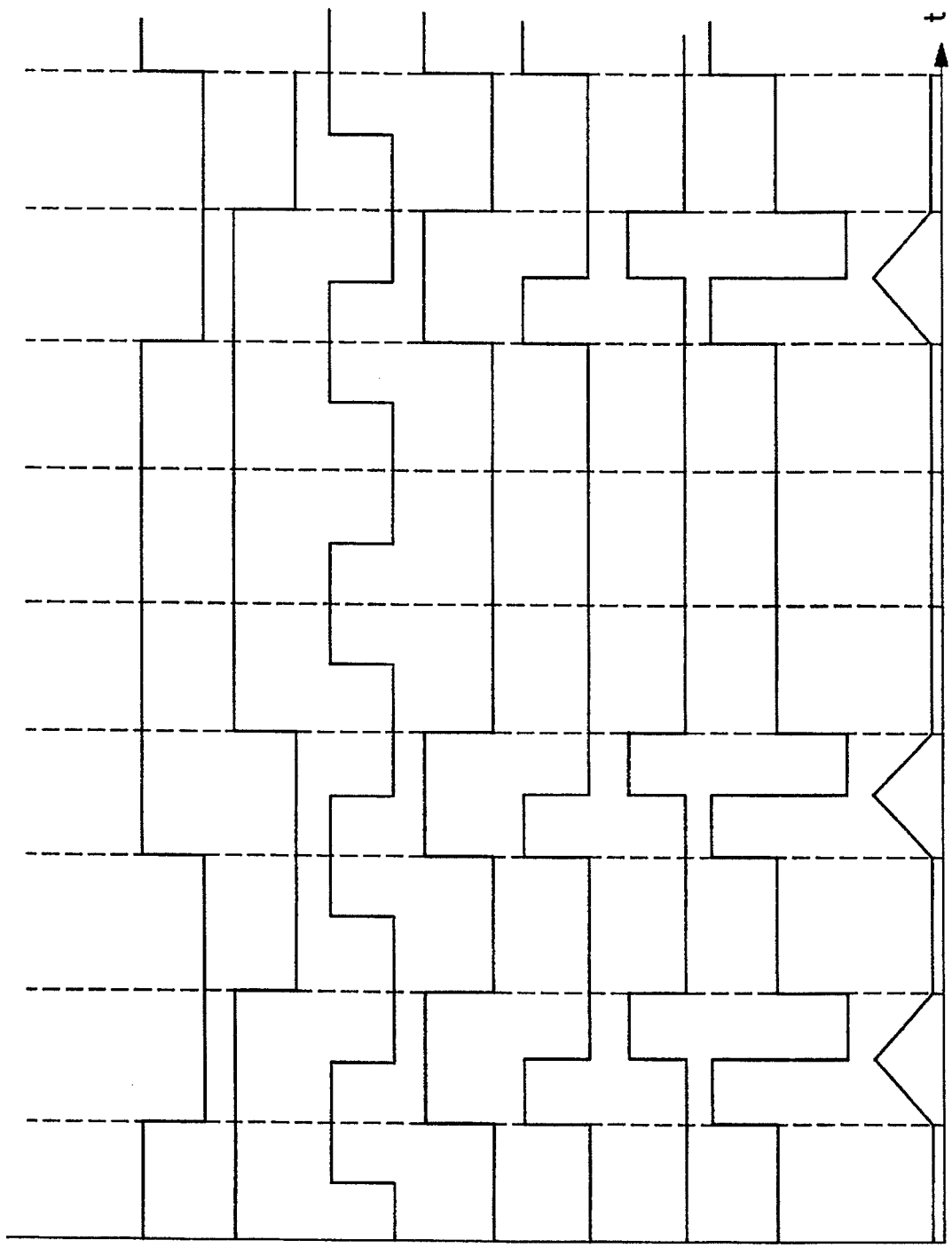
FIG. 2 illustrates a waveform diagram for the phase detector of FIG. 1.

FIG. 2 illustrates a waveform diagram for the phase detector of FIG. 1. Waveforms A, B, C, D, E, and F respectively represent the signals on node 112, node 116, the local clock, node 118, node 124, and node 126 for the phase detector of FIG. 1. Waveform G represents the difference signal, and waveform H represents the integrated signal. FIG. 2 illustrates waveforms for the phase detector of FIG. 1 when the phase detector is balanced.

As illustrated in FIG. 2, when a transition edge is detected in the data signal on node 112 (waveform A), the phase detector of FIG. 1 generates, when balanced, a pump-up pulse (waveform E) followed by a pump-down pulse (waveform F) of approximately equal amplitude and duration as the pump-up pulse even though the local clock is synchronized with the data signal. Type I clock feedthrough results as the frequency of the local clock is increased during the pump-up pulse and then decreased during the pump-down pulse, creating jitter for the local clock.

The net energy transferred by the difference signal (waveform G) into the integrator is proportional to the energy transferred by the pump-up signal (waveform E) minus the energy transferred by the pump-down signal (waveform F). The integrator generates a control signal (waveform H) in response to the difference signal (waveform G). This control signal contains a net transfer of energy in one direction that is a function of the transition edge density in data signals received on node 112 (waveform A). Type II clock feedthrough results as this net DC imbalance in the control signal causes dynamic phase offsets in the local clock as a function of transition edge density in received data signals, creating jitter for the local clock.

Figure 3:
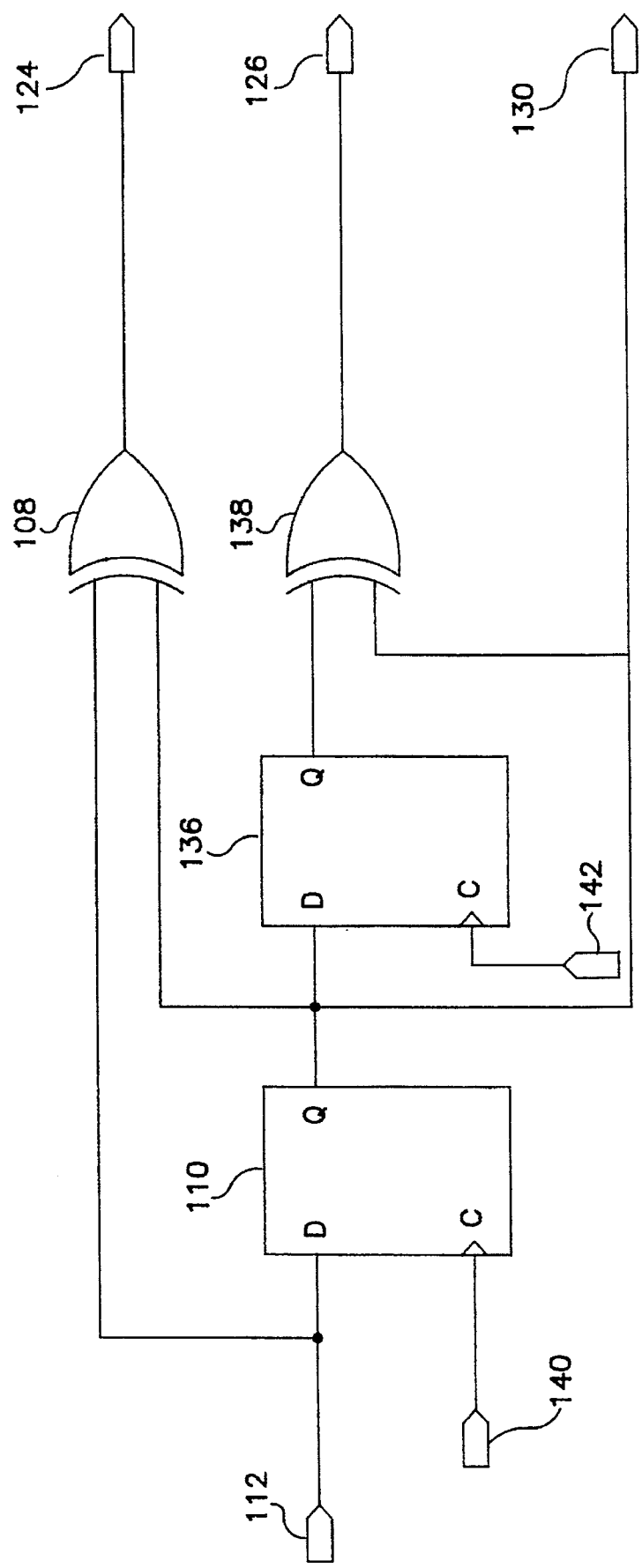
FIG. 3 illustrates circuitry for another phase detector.

FIG. 3 illustrates another phase detector. The phase detector of FIG. 3 includes D-type flip-flops 110 and 136 and XOR gates 108 and 138.

For the phase detector of FIG. 3, a data signal is received on node 112 from a transmitting unit. The D, C, and Q terminals of D-type flip-flop 110 are respectively coupled to node 112, node 140, and node 130. Node 140 is coupled to the local clock. Node 112 is coupled to the first input terminal of XOR gate 108. Node 130 is coupled to the second input terminal of XOR gate 108 and to the second input terminal of XOR gate 138. The D, C, and Q terminals of D-type flip-flop 136 are respectively coupled to node 130, node 142, and the first input terminal of XOR gate 138. Node 142 is coupled to the logical inversion of the local clock. The output terminals of XOR gates 108 and 138 are nodes 124 and 126, respectively.

The data signal received on node 112 is recovered on node 130 for the phase detector of FIG. 3. D-type flip-flop 110 is clocked off the appropriate edge, for example the rising edge, of the local clock and samples the data signal on node 112 to generate the data signal on node 130.

D-type flip-flop 136 is clocked off the appropriate edge, for example the rising edge, of the logical inversion of the local clock and samples the data signal on the Q terminal of D-type flip-flop 110. XOR gate 108 exclusive-ORs the data signal on node 112 with the sampled data signal on the Q terminal of D-type flip-flop 110. XOR gate 108 as a result outputs on node 124 a pump-up signal having a variable width pulse set by the spacing between a transition edge in the data signal on node 112 and the transition edge of the sampled data signal from D-type flip-flop 110. When the phase detector of FIG. 3 is balanced, the width of the pulse on node 124 is approximately one-half the clock period of the local clock. XOR gate 138 exclusive-ORs the sampled data signal on the Q terminal of D-type flip-flop 110 with the sampled data signal on the Q terminal of D-type flip-flop 136. XOR gate 138 as a result outputs on node 126 a pump-down signal having a reference pulse generated by alternate edges of the local clock. The pump-down reference pulse has a width of approximately one-half the clock period of the local clock.

The pump-down signal on node 126 may be subtracted from the pump-up signal on node 124 to produce a difference signal, and this difference signal may be integrated by an integrator. The resulting integrated signal may be used as a control signal for a voltage controlled oscillator (VCO) that controls the frequency of the local clock and of the logical inversion of the local clock. The frequency of the VCO changes as a function of the integrated value of the control signal.

Figures 4A, 4B, 4C, 4D, 4E, 4F:
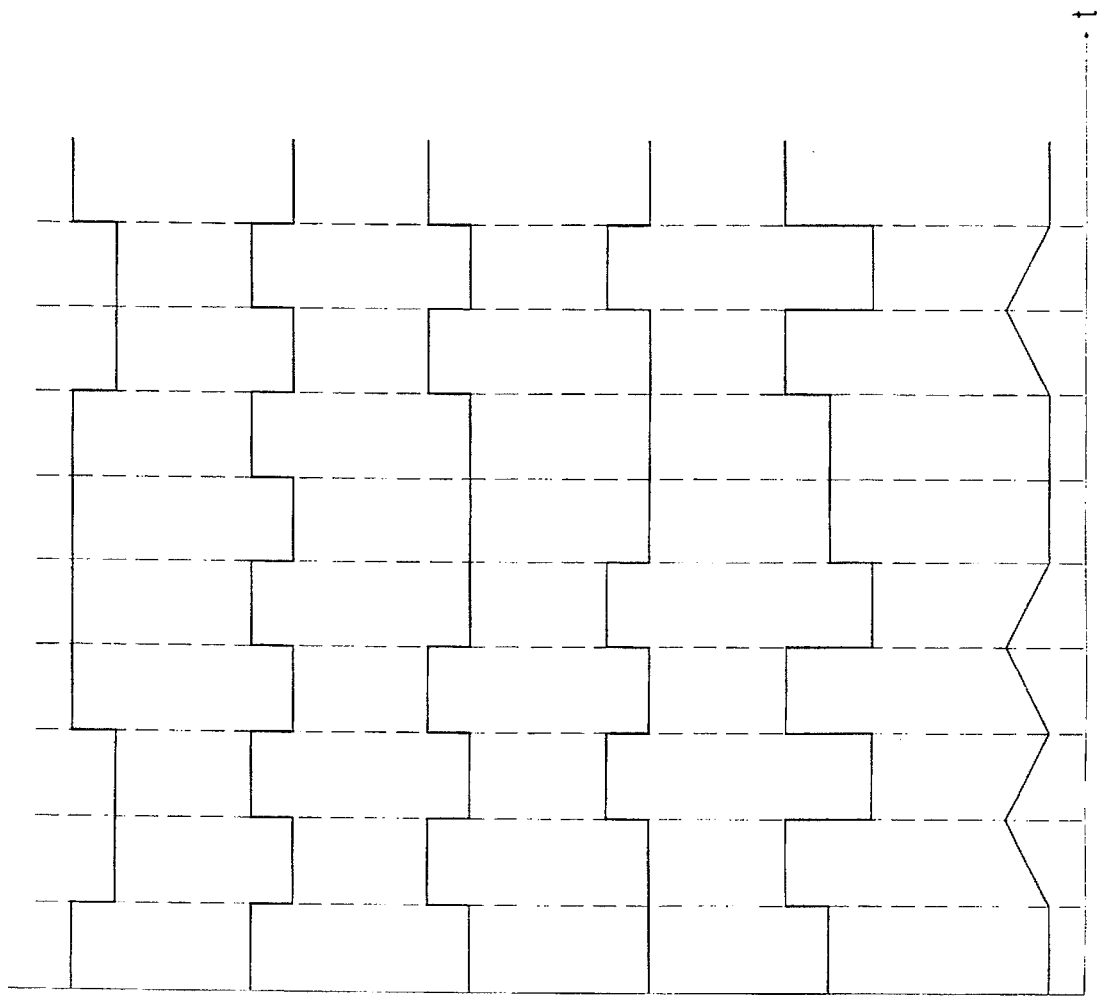
FIG. 4 illustrates a waveform diagram for the phase detector of FIG. 3.

FIG. 4 illustrates a waveform diagram for the phase detector of FIG. 3. Waveforms A, B, C and D respectively represent the signals on node 112, the local clock, node 124, and node 126 for the phase detector of FIG. 3. Waveform E represents the difference signal, and waveform F represents the integrated signal. FIG. 4 illustrates waveforms for the phase detector of FIG. 3 when the phase detector is balanced.

As illustrated in FIG. 4, when a transition edge is detected in the data signal on node 112 (waveform A), the phase detector of FIG. 3 generates, when balanced, a pump-up pulse (waveform C) followed by a pump-down pulse (waveform D) of approximately equal amplitude and duration as the pump-up pulse. Type I and Type II clock feedthrough results for reasons similar to those for the phase detector of FIG. 1.

Figure 5:
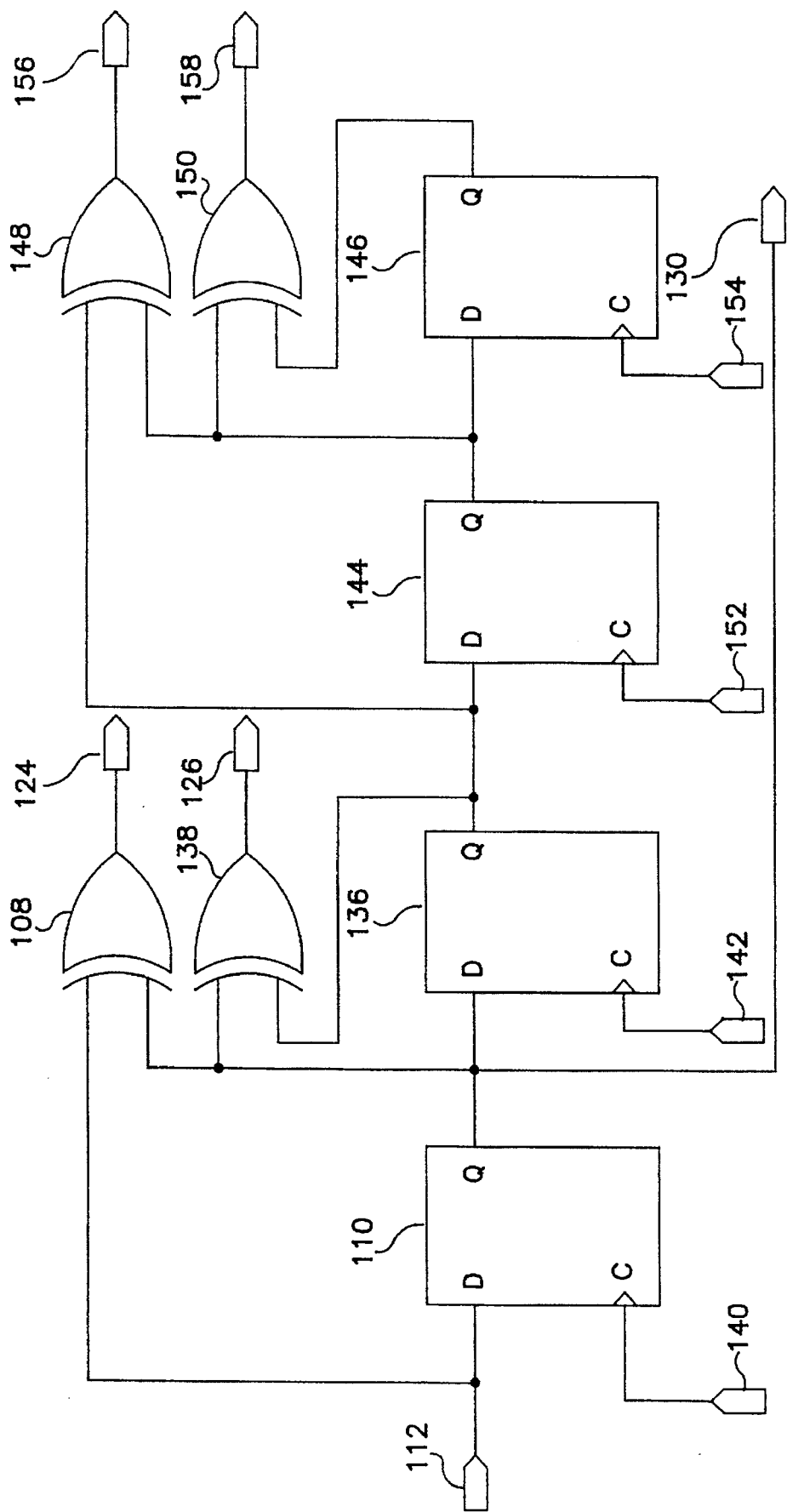
FIG. 5 illustrates circuitry for another phase detector.

FIG. 5 illustrates another phase detector. The circuit elements of FIG. 5 that are common to the phase detector of FIG. 3 are coupled and function in substantially the same manner as those for the phase detector of FIG. 3. The phase detector of FIG. 5 also includes D-type flip-flops 144 and 146 and XOR gates 148 and 150.

For the phase detector of FIG. 5, a data signal is received on node 112 from a transmitting unit. The data signal received on node 112 is recovered on node 130. The D, C, and Q terminals of D-type flip-flop 144 are respectively coupled to the Q terminal of D-type flip-flop 136, node 152, and the second input terminal of XOR gate 148. The Q terminal of D-type flip-flop 136 is also coupled to the first input terminal of XOR gate 148. The Q terminal of D-type flip-flop 144 is also coupled to the first input terminal of XOR gate 150. The D, C, and Q terminals of D-type flip-flop 146 are respectively coupled to the Q terminal of D-type flip-flop 144, node 154, and the second input terminal of XOR gate 150. Node 152 is coupled to the local clock, and node 154 is coupled to the logical inversion of the local clock. The output terminals of XOR gates 148 and 150 are nodes 156 and 158, respectively.

D-type flip-flop 144 is clocked off the appropriate edge, for example the rising edge, of the local clock and samples the data signal on the Q terminal of D-type flip-flop 136. D-type flip-flop 146 is clocked off the appropriate edge, for example the rising edge, of the logical inversion of the local clock and samples the data signal on the Q terminal of D-type flip-flop 144. XOR gate 148 exclusive-ORs the sampled data signal on the Q terminal of D-type flip-flop 136 with the sampled data signal on the Q terminal of D-type flip-flop 144. XOR gate 148 as a result outputs on node 156 a pump-down signal having a reference pulse generated by alternate edges of the local clock. The pump-down reference pulse has a width of approximately one-half the clock period of the local clock. XOR gate 150 exclusive-ORs the sampled data signal on the Q terminal of D-type flip-flop 144 with the sampled data signal on the Q terminal of D-type flip-flop 146. XOR gate 150 as a result outputs on node 158 a pump-up signal having a reference pulse generated by alternate edges of the local clock. The pump-up reference pulse has a width of approximately one-half the clock period of the local clock.

The pump-down signal on node 126 may be subtracted from the pump-up signal on node 124 to produce a first difference signal, and the pump-down signal on node 156 may be subtracted from the pump-up signal on node 158 to produce a second difference signal. The first and second difference signals may be added to produce an added difference signal, and this added difference signal may be integrated by an integrator. The resulting integrated signal may be used as a control signal for a voltage controlled oscillator (VCO) that controls the frequency of the local clock and of the logical inversion of the local clock. The frequency of the VCO changes as a function of the integrated value of the control signal.

Figures 6A, 6B, 6C, 6D, 6E, 6F, 6G, 6H:
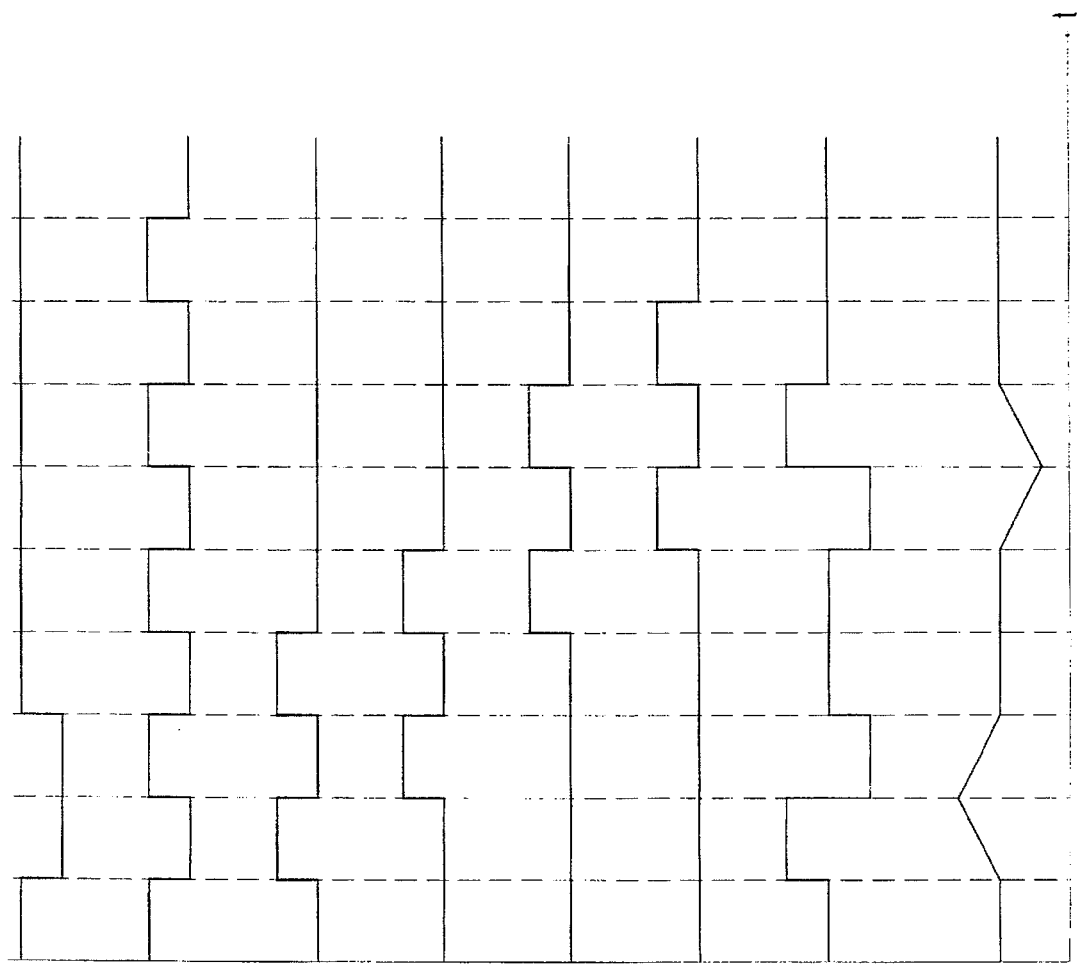
FIG. 6 illustrates a waveform diagram for the phase detector of FIG. 5.

FIG. 6 illustrates a waveform diagram for the phase detector of FIG. 5. Waveforms A, B, C, D, E and F respectively represent the signals on node 112, the local clock, node 124, node 126, node 156, and node 158 for the phase detector of FIG. 5. Waveform G represents the added difference signal and waveform H represents the integrated signal. FIG. 6 illustrates waveforms for the phase detector of FIG. 5 when the phase detector is balanced.

For the phase detector of FIG. 5, the problem of DC imbalance in the control signal is addressed by sending to the integrator an additional set of pump-down and pump-up pulses on nodes 156 and 158, respectively, after the pump-up and pump-down pulses on nodes 124 and 126, respectively. The second set of pulses come in the pump-down then pump-up order to cause the integrator to swing in the opposite direction, canceling the net DC imbalance transferred by the pump-up followed by pump-down pulses on nodes 124 and 126, respectively.

As illustrated in FIG. 6, the net energy transferred by the added difference signal (waveform G) into the integrator is proportional to the energy transferred by the first pump-up signal (waveform C) minus the energy transferred by the first pump-down signal (waveform D) minus the energy transferred by the second pump-down signal (waveform E) plus the energy transferred by the second pump-up signal (waveform F). The integrator generates a control signal (waveform H) in response to the added difference signal (waveform G). This control signal is net DC balanced because it contains a minimal or approximately zero net transfer of energy as a function of the transition edge density in data signals received on node 112 (waveform A). The phase detector of FIG. 5 thus helps to minimize or eliminate the net DC imbalance in the control signal supplied to the VCO, helping to minimize Type II clock feedthrough.

Although the phase detector of FIG. 5 addresses the problem of Type II clock feedthrough, this phase detector nevertheless creates jitter for the local clock as a result of Type I clock feedthrough. As illustrated in FIG. 6, when a transition edge is detected in the data signal on node 112 (waveform A), the phase detector of FIG. 5 generates, when balanced, a first pump-up pulse (waveform C) followed by a first pump-down pulse (waveform D) of approximately equal amplitude and duration as the first pump-up pulse. The phase detector then generates a second pump-down pulse (waveform E) followed by a second pump-up pulse (waveform F) of approximately equal amplitude and duration as the second pump-down pulse.

Type I clock feedthrough results because the frequency of the local clock is increased during the first pump-up pulse and then decreased during the first pump-down pulse, creating jitter for the local clock. Type I clock feedthrough further results because the frequency of the local clock is decreased during the second pump-down pulse and then increased during the second pump-up pulse, creating jitter for the local clock. Because of the additional set of pulses that are placed into the integrator, the resulting phase deviations in the control voltage for the voltage controlled oscillator (VCO) may be approximately twice the magnitude as those created by the phase detectors of FIGS. 1 and 3.

Figure 7:
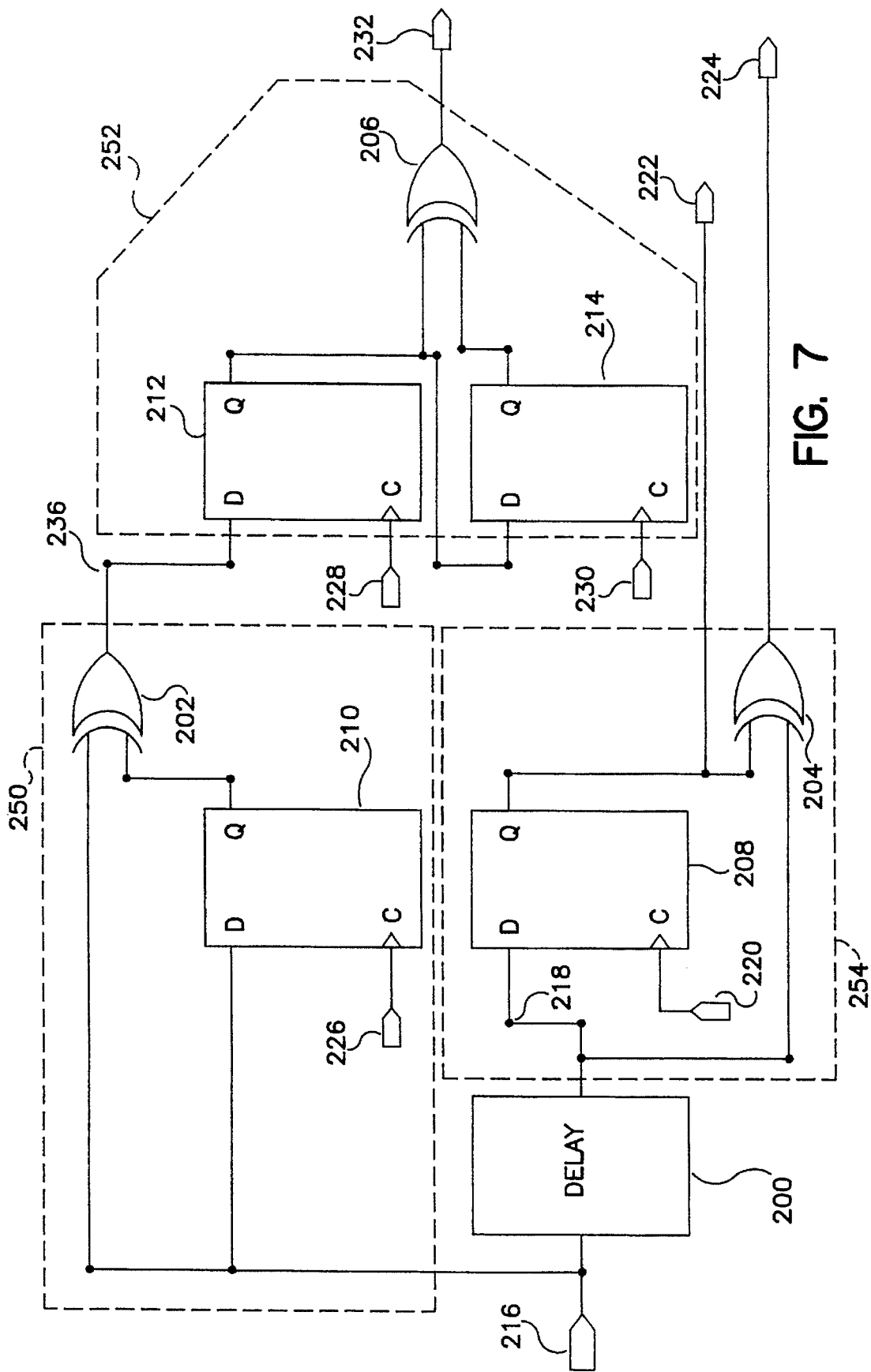
FIG. 7 illustrates circuitry for another phase detector.

FIG. 7 illustrates, for one embodiment, a pulsed tri-state phase detector for reduced jitter clock recovery. The phase detector of FIG. 7 includes circuitry 250, 252, and 254 and delay circuitry 200.

For the phase detector of FIG. 7, a data signal is received on node 216 from a transmitting unit. The input node of circuitry 250 is coupled to node 216. The output node of circuitry 250, node 236, is coupled to the input node of circuitry 252. The output node of circuitry 252 is node 232. The input node of delay circuitry 200 is coupled to node 216. The output node of delay circuitry 200, node 218, is coupled to the input node of circuitry 254. The output nodes of circuitry 254 are nodes 222 and 224. The data signal received on node 216 is recovered on node 222.

Circuitry 250 detects a transition edge in the data signal on node 216 and outputs to circuitry 252 a variable width pulse on node 236. Circuitry 252, in response to the pulse on node 236, outputs on node 232 a reference pulse generated by alternate edges of the local clock.

Additionally, delay circuitry 200 delays the data signal on node 216 and outputs the delayed data signal on node 218. For one embodiment, the propagation delay of delay circuitry 200 may be, for example, equal to approximately one-half of the period of the clock local to the transmitting unit. Circuitry 254 samples the delayed data signal on node 218 and outputs the sampled data signal on node 222. Circuitry 254 also detects a transition edge in the delayed data signal on node 218 and outputs on node 224 a variable width pulse indicative of phase.

Because of delay circuitry 200, circuitry 250 detects a transition edge in the data signal received on node 216 relatively earlier than circuitry 254. As both the reference pulse on node 232 and the variable width pulse on node 224 are generated in response to the transition edge on node 216, delay circuitry 200 determines when the variable width pulse is generated on node 224 with respect to when the reference pulse is generated on node 232. Circuitry 252 may output on node 232 the reference pulse while circuitry 254 may simultaneously output on node 224 the variable width pulse indicative of phase. The variable width pulse on node 224 may be generated to overlap in time with the reference pulse on node 232. The term overlap includes a partial overlap, a full or complete overlap, and an exact or substantially exact overlap, for example.

Circuitry 250 includes exclusive-OR (XOR) gate 202 and D-type flip-flop 210. The D, C, and Q terminals of D-type flip-flop 210 are respectively coupled to node 216, node 226, and the second input terminal of XOR gate 202. Node 226 is coupled to the logical inversion of the local clock. The first input terminal of XOR gate 202 is coupled to node 216. The output terminal of XOR gate 202 is coupled to node 236.

D-type flip-flop 210 is clocked off the appropriate edge, for example the rising edge, of the logical inversion of the local clock and samples or retimes the data signal received on node 216. XOR gate 202 exclusive-ORs the data signal on node 216 with the sampled or retimed data signal on the Q terminal of D-type flip-flop 210. XOR gate 202 as a result outputs on node 236 a variable width pulse that has a width set by the spacing between a transition edge in the data signal on node 216 and the transition edge in the sampled data signal from D-type flip-flop 210. XOR gate 202 outputs on node 236 a pulse of known polarity after every transition edge on node 216 that is independent of the transition edge polarity. For one embodiment, the width of the pulse on node 236 is approximately one-half the clock period of the local clock when the phase detector of FIG. 7 is balanced.

Circuitry 252 includes XOR gate 206 and D-type flip-flops 212 and 214. The D, C, and Q terminals of D-type flip-flop 212 are respectively coupled to node 236, node 228, and the first input terminal of XOR gate 206. Node 228 is coupled to the logical inversion of the local clock. The D, C, and Q terminals of D-type flip-flop 214 are respectively coupled to the Q terminal of D-type flip-flop 212, node 230, and the second input terminal of XOR gate 206. Node 230 is coupled to the local clock. The output terminal of XOR gate 206 is coupled to node 232.

D-type flip-flop 212 is clocked off the appropriate edge, for example the rising edge, of the logical inversion of the local clock and samples or retimes the signal received on node 236. D-type flip-flop 214 is clocked off the appropriate edge, for example the rising edge, of the local clock and samples or retimes the sampled signal on the Q terminal of D-type flip-flop 212. XOR gate 202 exclusive-ORs the sampled signal on the Q terminal of D-type flip-flop 212 with the sampled signal on the Q terminal of D-type flip-flop 214. XOR gate 206 as a result outputs on node 232 a pump-down signal that includes a reference pulse having a width set by the spacing between the transition edge in the sampled signal from D-type flip-flop 212 and the transition edge in the sampled signal from D-type flip-flop 214. The pump-down reference pulse is generated by alternate edges of the local clock and has a width of approximately one-half the clock period of the local clock. XOR gate 206 outputs on node 232 a pulse of known polarity after every transition edge on node 236 that is independent of the transition edge polarity.

Circuitry 254 includes XOR gate 204 and D-type flip-flop 208. The D, C, and Q terminals of D-type flip-flop 208 are respectively coupled to node 218, node 220, and the first input terminal of XOR gate 204. The second input terminal of XOR gate 204 is coupled to node 218. Node 220 is coupled to the local clock. Node 222 is coupled to the Q terminal of D-type flip-flop 208. The output terminal of XOR gate 204 is coupled to node 224.

D-type flip-flop 208 is clocked off the appropriate edge, for example the rising edge, of the local clock and samples or retirees the delayed data signal received on node 218. D-type flip-flop 208 outputs on node 222 this sampled data signal as the recovered data signal for the data signal received on node 216. XOR gate 204 exclusive-ORs the delayed data signal on node 218 with the sampled or retimed data signal on the Q terminal of D-type flip-flop 208. XOR gate 204 as a result outputs on node 224 a pump-up signal that includes a variable width pulse having a width set by the spacing between a transition edge in the delayed data signal on node 218 and the transition edge in the sampled data signal from D-type flip-flop 208. XOR gate 204 outputs on node 224 a pulse of known polarity after every transition edge on node 218 that is independent of the transition edge polarity. For one embodiment, the width of the pulse on node 224 is approximately one-half the clock period of the local clock when the phase detector of FIG. 7 is balanced.

Circuitry 250, 252, and 254 may include other suitable circuitry. For example, the D-type flip-flops may be replaced with suitable latching or sample-and-hold storage circuitry, for example. Additionally, the logic gates may include Bipolar gates, CML/ECL gates, CMOS gates, or other suitable logic circuit technology.

The pump-down signal on node 232 may be subtracted from the pump-up signal on node 224 to produce a difference signal, and this difference signal may be integrated by an integrator. The resulting integrated signal may be used as a control signal for a voltage controlled oscillator (VCO) that controls the frequency of the local clock and of the logical inversion of the local clock. The frequency of the VCO changes as a function of the integrated value of the control signal.

FIG. 8 illustrates a waveform diagram for the phase detector of FIG. 7. Waveforms A, B, C, D, E and F respectively represent the signals on node 216, node 218, the local clock, node 236, node 224, and node 232 for the phase detector of FIG. 7. Waveform G represents the difference signal, and waveform H represents the integrated signal. FIG. 8 illustrates waveforms for the phase detector of FIG. 7 when the phase detector is balanced as the phase difference, or phase error, between the delayed data signal on node 218 (waveform B) and the local clock (waveform C) is approximately zero. That is, the delayed data signal on node 218 (waveform B) is aligned with the falling edge of the local clock (waveform C).

As illustrated in FIG. 8, when a transition edge is detected in the data signal on node 216 (waveform A), circuitry 250 outputs on node 236 a variable width pulse (waveform D). Circuitry 252 outputs on node 232 a pump-down reference pulse (waveform F) in response to this relatively early detection of a transition edge in the data signal by circuitry 250. The pump-down reference pulse (waveform F) is generated by alternate edges of the local clock and has a width of approximately one-half the clock period for the local clock (waveform C).

Delay circuitry 200 delays the data signal on node 216 (waveform A) and outputs on node 218 the delayed data signal (waveform B). When a transition edge is detected in the delayed data signal on node 218 (waveform B), circuitry 254 outputs on node 224 a pump-up, variable width pulse indicative of phase (waveform E). The pump-up pulse has a variable width set by the spacing between the detected transition edge on node 218 (waveform B) and the next appropriate edge, for example the rising edge, of the local clock (waveform C).

When a transition edge is detected in the data signal on node 216 (waveform A), the phase detector of FIG. 7 generates, when balanced, a pump-up pulse (waveform E) and a pump-down pulse (waveform F) of approximately equal amplitude and duration as the pump-up pulse. The pump-up pulse (waveform E) and the pump-down pulse (waveform F) overlap in time such that the pump-up pulse and the pump-down pulse substantially cancel out one another when the pump-down signal (waveform F) is subtracted from the pump-up signal (waveform E) to produce the difference signal (waveform G). Any change in frequency for the local clock as a result of the pump-up pulse and the pump-down pulse is minimized when the phase detector is balanced. Type I clock feedthrough is therefore minimized, helping to reduce jitter for the local clock.

The net energy transferred by the difference signal (waveform G) into the integrator is proportional to the energy transferred by the pump-up signal (waveform E) minus the energy transferred by the pump-down signal (waveform F). When the phase detector is balanced, the net energy transferred into the integrator is approximately zero as the pump-up pulse and the pump-down pulse substantially cancel out one another when the pump-down signal is subtracted from the pump-up signal. The integrator generates a control signal (waveform H) in response to the difference signal (waveform G). This control signal is net DC balanced because it contains a minimal or approximately zero net transfer of energy as a function of the transition edge density in data signals received on node 216 (waveform A). Type II clock feedthrough is therefore minimized, helping to reduce jitter for the local clock.

The phase detector of FIG. 7 thus helps to ensure that the local clock is subjected to phase deviations only when a transition edge in a received data signal is detected and when a net phase error is detected. That is, the phase detector of FIG. 7 helps to ensure the local clock is not unnecessarily subjected to phase deviations when the phase detector is balanced.

The phase detector of FIG. 7 also helps to ensure that the magnitude of any phase deviations for the local clock is no greater than that needed to compensate for a detected phase error. For example, if the received data signal is early with respect to the local clock, the variable width pulse indicative of phase grows in duration because its rising edge moves earlier in time. If the received data signal is late with respect to the local clock, the variable width pulse indicative of phase shrinks in duration because its rising edge moves later in time. The pump-down reference pulse in both instances has a width set by alternate edges of the local clock. When either of these conditions occur, the phase detector of FIG. 7 helps to ensure that the resulting difference signal has a duration approximately equal to the spacing between the transition edge in the delayed data signal on node 218 and the appropriate edge, for example the falling edge, of the local clock. The phase detector of FIG. 7 thus helps to ensure that only the amount of net energy needed to correct the phase error is transferred into the integrator.

In the foregoing description, the invention has been described with reference to specific exemplary embodiments thereof. It may, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method for outputting a variable width pulse indicative of phase and a reference pulse as phase detector outputs, comprising the steps of:

(a) receiving a first data signal having a first transition edge;

(b) detecting the first transition edge of the first data signal;

(c) outputting a reference pulse in response to the detection of the first transition edge of the first data signal and in accordance with a first clock edge and a second clock edge; and (d) outputting a variable width pulse indicative of phase in response to the detection of the first transition edge of the first data signal such that the variable width pulse overlaps in time with the reference pulse, and the variable width pulse and the reference pulse substantially cancel out one another when the phase detector is balanced, further wherein the step of outputting a variable width pulse includes the steps of:

(i) delaying the first data signal for a period of time to produce a delayed data signal having a second transition edge delayed from the first transition edge in the first data signal, ii) detecting the second transition edge of the delayed data signal, and (iii) outputting the variable width pulse indicative of phase in response to the detection of the second transition edge of the delayed data signal and in accordance with the second clock edge.

2. The method of claim 1, wherein the detecting step (b) includes the steps of:

(i) retiming the first data signal in accordance with a first clock edge to produce a first retimed data signal, and (ii) exclusive ORing the first retimed data signal with the first data signal to produce a second data signal indicative of the first transition edge of the first data signal.

3. The method of claim 2, wherein the outputting step (c) includes the steps of:

(i) retiming the second data signal in accordance with the first clock edge to produce a second retimed data signal, (ii) retiming the second retimed data signal in accordance with a second clock edge to produce a third retimed data signal, and (iii) exclusive ORing the second retimed data signal with the third retimed data signal to output the reference pulse.

4. The method of claim 1, wherein the delaying step (d)(i) includes the step of delaying the first data signal for a period of time equal to approximately one-half of a clock period for transmitting the first data signal.

5. The method of claim 1, wherein the detecting step (b) includes the steps of:

(i) retiming the first data signal in accordance with a first clock edge to produce a first retimed data signal, and (ii) exclusive ORing the first retimed data signal with the first data signal to produce a second data signal indicative of the first transition edge of the first data signal; and wherein the outputting step (c) includes the steps of:

(i) retiming the second data signal in accordance with the first clock edge to produce a second retimed data signal, (ii) retiming the second retimed data signal in accordance with a second clock edge to produce a third retimed data signal, and (iii) exclusive ORing the second retimed data signal with the third retimed data signal to output the reference pulse.

6. The method of claim 1, wherein the detecting step (d)(ii) and the outputting step (d)(iii) include the steps of:

(A) retiming the delayed data signal in accordance with a first clock edge to produce a first retimed data signal, and (B) exclusive ORing the delayed data signal with the first retimed data signal to output the variable width pulse.

7. The method of claim 6, wherein the detecting step (b) includes the steps of:

(i) retiming the first data signal in accordance with a second clock edge to produce a first retimed data signal, and (ii) exclusive ORing the first retimed data signal with the first data signal to produce a second data signal indicative of the first transition edge of the first data signal; and wherein the outputting step (c) includes the steps of:

(i) retiming the second data signal in accordance with the second clock edge to produce a second retimed data signal, (ii) retiming the second retimed data signal in accordance with first clock edge to produce a third retimed data signal, and (iii) exclusive ORing the second retimed data signal with the third retimed data signal to output the reference pulse.

8. A phase detector for outputting a variable width pulse indicative of phase and a reference pulse, comprising:

(a) first circuitry for receiving a first data signal having a first transition edge and for detecting the first transition edge of the first data signal;

(b) second circuitry, coupled to the first circuitry, for outputting a reference pulse in response to the detection of the first transition edge of the first data signal and in accordance with a first clock edge and a second clock edge; and (c) third circuitry, coupled to the first circuitry, for outputting a variable width pulse indicative of phase in response to the detection of the first transition edge of the first data signal, the third circuitry outputting the variable width pulse such that the variable width pulse overlaps in time with the reference pulse, and the variable width pulse and the reference pulse substantially cancel out one another when the phase detector is balanced, further wherein the third circuitry includes:

(i) delay circuitry for delaying the first data signal for a period of time to produce a delayed data signal having a second transition edge, (ii) detection circuitry for detecting the second transition edge of the delayed data signal, and (iii) output circuitry for outputting the variable width pulse indicative of phase in response to the detection of the second transition edge of the delayed data signal and in accordance with the second clock edge such that the reference pulse and the variable width pulse are aligned along the second clock edge.

9. The phase detector of claim 8, wherein the first circuitry (a) includes:

(i) circuitry for retiming the first data signal in accordance with a first clock edge to produce a first retimed data signal, and (ii) an exclusive OR gate for exclusive ORing the first retimed data signal with the first data signal to produce a second data signal indicative of the first transition edge of the first data signal.

10. The phase detector of claim 9, wherein the second circuitry (b) includes:

(i) circuitry for retiming the second data signal in accordance with the first clock edge to produce a second retimed data signal, (ii) circuitry for retiming the second retimed data signal in accordance with a second clock edge to produce a third retimed data signal, and (iii) an exclusive OR gate for exclusive ORing the second retimed data signal with the third retimed data signal to output the reference pulse.

11. The phase detector of claim 8, wherein the delay circuitry (c)(i) delays the first data signal for a period of time equal to approximately one-half of a clock period for transmitting the first data signal.

12. The phase detector of claim 8, wherein the first circuitry (a) includes:

(i) circuitry for retiming the first data signal in accordance with a first clock edge to produce a first retimed data signal, and (ii) an exclusive OR gate for exclusive ORing the first retimed data signal with the first data signal to produce a second data signal indicative of the first transition edge of the first data signal; and wherein the second circuitry (b) includes:

(i) circuitry for retiming the second data signal in accordance with the first clock edge to produce a second retimed data signal, (ii) circuitry for retiming the second retimed data signal in accordance with a second clock edge to produce a third retimed data signal, and (iii) an exclusive OR gate for exclusive ORing the second retimed data signal with the third retimed data signal to output the reference pulse.

13. The phase detector of claim 8, wherein the detection circuitry (c)(ii) and the output circuitry (c)(iii) include:

(A) circuitry for retiming the delayed data signal in accordance with a first clock edge to produce a first retimed data signal, and (B) an exclusive OR gate for exclusive ORing the delayed data signal with the first retimed data signal to output the variable width pulse.

14. The phase detector of claim 13, wherein the first circuitry (a) includes:

(i) circuitry for retiming the first data signal in accordance with a second clock edge to produce a first retimed data signal, and (ii) an exclusive OR gate for exclusive ORing the first retimed data signal with the first data signal to produce a second data signal indicative of the first transition edge of the first data signal; and wherein the second circuitry (b) includes:

(i) circuitry for retiming the second data signal in accordance with the second clock edge to produce a second retimed data signal, (ii) circuitry for retiming the second retimed data signal in accordance with first clock edge to produce a third retimed data signal, and (iii) circuitry for exclusive ORing the second retimed data signal with the third retimed data signal to output the reference pulse.

* * * * *